United States Patent [19]

Luscher

[11] 3,845,331

[45] Oct. 29, 1974

[54] ARRANGEMENTS FOR BIASING THE SUBSTRATE OF AN INTEGRATED CIRCUIT

[75] Inventor: Jakob Luscher, Carouge/Geneve, Switzerland

[73] Assignee: Battelle Memorial Institute, Carouge/Geneve, Switzerland

[22] Filed: June 26, 1973

[21] Appl. No.: 373,872

[30] Foreign Application Priority Data

June 27, 1972 Switzerland .......................... 9644/72

[52] U.S. Cl. ........................ 307/304, 357/23, 357/24, 357/41

[51] Int. Cl. ............................................ H01l 11/14

[58] Field of Search ...... 317/235 G, 235 B; 307/304

[56] References Cited

OTHER PUBLICATIONS

H. Frantz et al., I.B.M. Tech. Discl. Bull., Vol. 13, No. 8, January 1971, p. 2385.

H. Frantz et al., I.B.M. Tech. Discl. Bull., Vol. 11, No. 10, March 1969, p. 1219.

H. Frantz, I.B.M. Tech. Discl. Bull., Vol, 12, No. 12, May 1970, p. 2078.

*Primary Examiner*—Martin H. Edlow
*Attorney, Agent, or Firm*—Karl F. Ross; Herbert Dubno

[57] ABSTRACT

An arrangement for biasing the substrate of an integrated circuit comprises *n* insulated gate field effect transistors integrated in the substrate and each having a source region, a drain region, and a gate connected to the drain region. The source regions of the *n* transistors are formed by *n* zones of opposite type of conductivity to the substrate, and the drain regions of the first to *n*-1th transistors are formed by the second to *n*th zones, respectively. The drain region of the *n*th transistors is formed by an *n*+1th zone of the said opposite type of conductivity, and the second to *n*+1th zones are capacitively coupled respectively with *n* electrodes. The arrangement also comprises a signal generator having *n* outputs which provides at each output a periodic signal which is displaced in time with respect to the periodic signals provided at the other outputs. Each of the *n* electrodes is connected to one of the *m* outputs of the signal generator, and the *m* outputs are connected to respective electrodes in each group of *m* consecutive electrodes formed from the *n* electrodes.

2 Claims, 6 Drawing Figures

ARRANGEMENTS FOR BIASING THE SUBSTRATE OF AN INTEGRATED CIRCUIT

Figure 1:
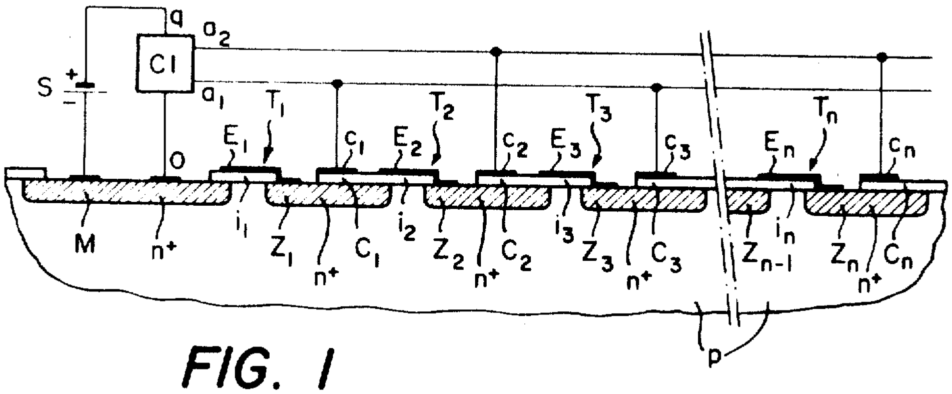

This invention relates to integrated circuits.

It has already been proposed to bias the substrate of an integrated electronic circuit with the aid of a structure integrated into this substrate and comprising a field effect transistor having an insulated gate which is galvanically connected to the drain of the transistor, and a capacitor having one electrode connected to the said drain and intended to receive periodic sitnals at its other electrode. Such a circuit is described notably in the article "Mosfet Substrate Bias Voltage Generator" forming the subject of page 8219 of the publication "IBM Technical Disclosure Bulletin,"No. 10, March 1969.

When the integrated circuit whose substrate is to be biased forms, notably, part of a portable apparatus, it is desirable to create the periodic signals necessary for the control of the bias by means of a generator whose electronic components are also integrated in the same substrate, and to supply the electrical energy to the whole from a battery enclosed in the apparatus. However, if it is desired to use a generator of simple structure which can thus be readily integrated, as in the case of a multivibrator, for example, it then becomes difficult to obtain a substrate bias-voltage which is higher than the voltage supplied by the battery.

When this battery has particularly small dimensions, more especially when it is intended to be lodged in the casing of a wrist watch, some or all of the electronic circuits of which are provided in integrated form on a substrate which is to be biased, it is not always possible to obtain the most appropriate bias voltage since the voltage of mercuric oxide and silver oxide cells, which are those most commonly employed, are 1.3 and 1.5 volts respectively.

According to the present invention there is provided, in combination: an integrated circuit having a substrate made of semiconductor material of one type of conductivity in which there are integrated $n$ insulated gate field effect transistors each having a source region, a drain region, and a gate connected to the said drain region, the source regions of the said $n$ field effect transistors being formed respectively by $n$ zones of semiconductor material of opposite type of conductivity to the said substrate, the drain regions of the first to $n$-1th field effect transistors being formed by the second to nth zones respectively, and the drain region of the $n$th field effect transistor being formed by an $n$-1th zone of semiconductor material of the said opposite type of conductivity, the second to $n$-1th zones being capacitively coupled respectively with $n$ electrodes; and signal-generation circuity having $m$ outputs and operative to provide at each output a periodic signal which is displaced in time with respect to the periodic signals provided at the other outputs; each of the said $n$ electrodes being connected to one of the said $m$ outputs of the signal-generation circuitry, the said $m$ outputs being connected to respective electrodes in each group of $m$ consecutive electrodes formed from the $n$ electrodes.

The present invention may be used to make it possible to bias the substrate of an integrated electrode circuit with a voltage which may be a number of times higher than that of the battery by which such a circuit is supplied, regardless of the structure of the periodic-signal generator employed.

Optionally, the combination comprises in addition a highly doped semiconductive zone of the same type of conductivity as the substrate, this zone being galvanically connected to the $n$-1th zone of the said opposite type of conductivity.

Figure 2A:
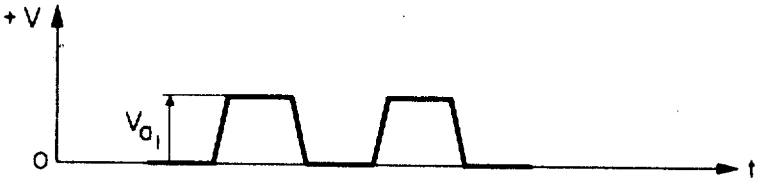
Figure 2B:
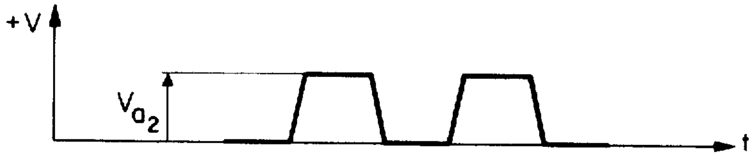
Figure 3:
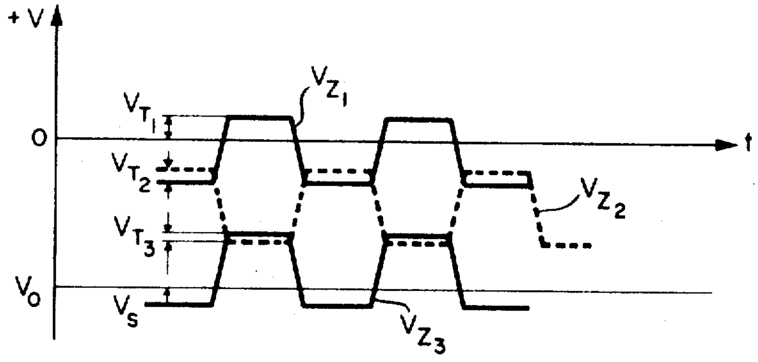
Figure 4:
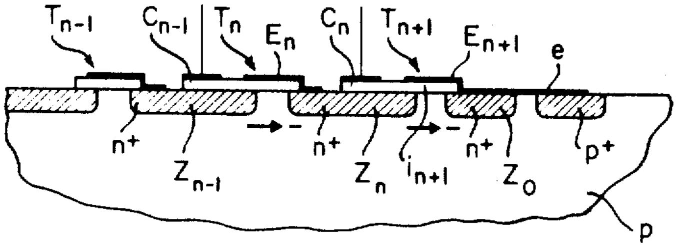
Figure 5:
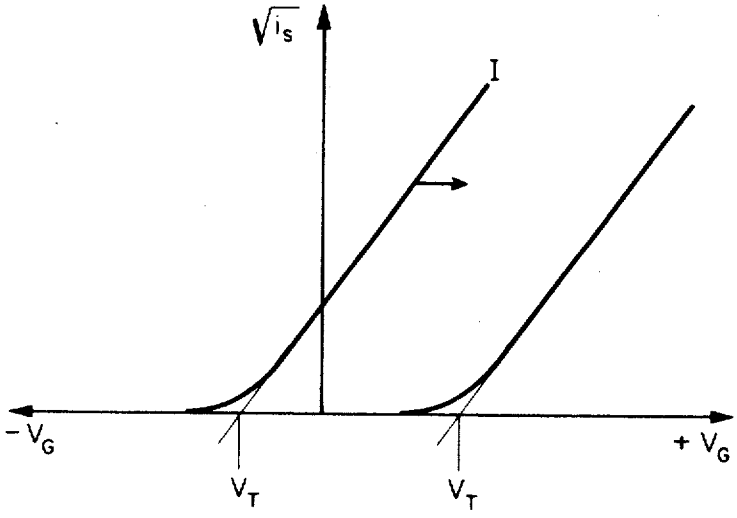

For a better understanding of the invention, and to show how the same may be carried into effect, reference will now be made, by way of example, to the accompanying drawings in which:

FIG. 1 shows diagrammatic sectional view of the component elements of one form of construction of a combination embodying the present invention, FIGS. 2*a*, 2*b* and 3 show explanatory waveform diagrams, FIG. 4 shows a diagrammatic sectional view of a modification of the FIG. 1 combination, and FIG. 5 shows graphs illustrating the variation of the saturation current of an insulated gate field effect transistor as a function of its gate voltage.

FIG. 1 shows a substrate $p$ which may consist, for example, of a Si crystal, in the upper surface of which there are integrated ($n$-1) semiconductive zones M, $Z_1$, $Z_2$ . . . $Z_n$ of opposite type of conductivity to the substrate. In the present instance the substrate is of $p$-type conductivity and the zones of $n^+$ *type*.

These various semiconductive zones form, in cooperation with electrodes $E_1$, $E_2$ to $E_n$, which consist of layers of aluminum deposited upon insulating layers of $SiO_2$, $i_1$ to $i_n$, insulated gate field effect transistors. As will be seen from FIG. 1, the various intermediate semiconductive zones ($Z_1$ to $Z_{n-1}$) constitute at the same time the drain of a transistor, for example the transistor $T_1$ in the case of the zone $Z_1$, and the source of the following transistor, in the present case the transistor $T_2$. It is to be observed that each of the electrodes $E_1$ to $E_n$ is galvanically connected to the zone Z forming the drain of the corresponding transistor.

With regard to the first transistor $T_1$, its source consists of the first semiconductive zone M; in the case of the last transistor $T_n$, the drain is formed by the last zone $Z_n$.

As will be seen from FIG. 1, each of the zones $Z_1$ to $Z_n$ also contitutes one of the electrodes of a capacitor $C_1$ to $C_n$ whose other electrode is formed by a conductive or semiconductive deposit $c_1$ to $c_n$, for example of aluminium. It will be observed in this connection that the deposits $c_1$ to $c_{n-1}$ are entirely isolated from each of the electrodes $E_2$ to $E_n$ adjacent thereto. Finally, it is to be noted that the surface area occupied by the zone M is made greater than the surface area of any other zone $Z_1$ to $Z_n$, so that the capacitance of the capacitor formed by the junction between this zone M and the substrate $p$ is greater than the capacitance of the capacitor formed by the junction between any other of the semiconductive zones $Z_1$ to $Z_n$ and the substrate, and in particular between any of the intermediate zones $Z_1$ to $Z_{n-1}$ and the substrate, in order to minimise the value of the alternating voltage existing between the zone M and the substrate $p$.

The illustrated assembly further comprises a generator CI which supplies at its two outputs $a_1$ and $a_2$ periodic signals which are time-staggered from output to output (see FIGS. 2*a* and 2*b*) and which are supplied by a unidirectional-voltage source S, in the present instance a battery connected by its negative pole to the semiconductive zone M and by its positive pole to one terminal $q$ of two supply terminals of the generator, the other terminal 0 of which is also connected to the zone M.

The electrodes $c_1, c_2 \ldots c_n$ of the capacitors $C_1, C_2 \ldots C_n$ are alternately connected to the outputs $a_1$ and $a_2$, respectively, of the generator $C_1$, so that these electrodes are supplied with periodic signals which are phase-shifted from electrode to electrode.

It is to be noted that, although diagrammatically represented by a block, the generator CI will also with advantage comprise electrode components which are integrated into the integration substrate of the zones M and $Z_1$ to $Z_n$. For example, the generator may have the form of a multivibrator or of a symmetrical oscillator. In the latter case, the signals set up at the terminals $a_1$ and $a_2$ will consist of two sinusoidal voltages which are out of phase by 180°.

As may be seen from FIG. 1, the assembly of elements $M, Z_1, Z_2 \ldots Z_n; E_1, E_2 \ldots E_n; c_1, c_2, \ldots c_n$ constitutes, in the form of a chain, a plurality of elementary bias circuits which comprise the elements M, $E_1$, $Z_1$ and $C_1$, in the case of the first, $Z_1$, $E_2$, $Z_2$ and $C_2$ in the case of the second, $Z_2$, $E_3$, $Z_3$ and $C_3$ in the case of the third, $Z_3$, $E_4$, $Z_4$ and $C_4$ in the case of the fourth, $\ldots Z_{n-1}$, $E_n$, $Z_n$ and $C_n$ in the case of the $n$th, and each of which is controlled by a pulse which is out of phase in relation to the pulse which controls the preceding elementary circuit.

For example, in the case where $n$ is equal to 3 and where the amplitude of the voltage $Va_1$ is equal to the amplitude of the voltage $Va_2$, i.e., where $Va_1 = Va_2 = V_a$, and where the capacitance of the capacitors formed by the junction between the zones $Z_1$, $Z_2$ and $Z_3$ and the substrate is negligible in relation to the capacitance of the capacitors $C_1$, $C_2$ and $C_3$, it can be shown that the potential $V_o$ of the crystal in relation to the zone M is approximately:

$-3V_a + V_{T_1} + V_{T_2} + V_{T_3} + V_s$, in which relation $V_s$ is the threshold voltage of the diode formed by the junction of the zone $Z_3$, $V_{T_1}$ is the threshold voltage of the transistor $T_1$ if the source of the latter is biased with a voltage $V_o$ in relation to the crystal V, $V_{T_2}$ is the threshold voltage of the transistor $T_2$ which has a bias voltage equal to $-2V_a + V_{T_2} + V_{T_3} + V_s$, and $V_{T_2}$ is the threshold voltage of the transistor $T_3$ having a bias voltage equal to $-V_a + V_{T_3} + V_s$.

Indeed, when the potential of a zone of $n^{115}$ type becomes negative in relation to that of the adjacent zone of higher order and exceeds the threshold voltage of the transistor whose control electrode is connected to the latter zone, electrons are transferred from the first one of these zones to the second. Consequently, by reason of the fact that an alternating potential corresponding to the voltage $Va_1$ and $Va_2$ applied to the capacitors $C_1$ to $C_3$ is superimposed upon the unidirectional potential of the zones $Z_1$ to $Z_3$ in relation to the substrate, the electrons of the zone M are transferred to the zone $Z_1$, and then from this zone to the succeeding zone $Z_2$, and so on until these electrons are injected from the last zone Z into the substrate. In this way, the zone M becomes positively charged in relation to the substrate until the balanced state is reached, that is to say, until only the thermally created electrons are evacuated.

The result of this process is that a potential $V_Z$ is set up at each of the zones $Z_1$ to $Z_3$, the curve form of which potential is shown in FIG. 3 (curves $V_{Z_1}$, $V_{Z_2}$ and $V_{Z_3}$). This same figure also shows the value of the potential $V_o$ of the substrate in relation to the zone M.

In the modification shown in FIG. 4, the assembly comprises in addition a zone $Z_o$ of $n^{115}$ type, which is succeeded by a $p^{115}$ zone, and an electrode $E_{n+1}$ insulated from the substrate by a layer $i_{n+1}$ and having an extension $e$, by means of which it is in contact with the zone $Z_o$ and which connects this zone to the $p^{115}$ zone. The zones $Z_n$ and $Z_o$ form, with the electrode $E_{n+1}$, an insulated gate field effect transistor $T_{n+1}$, of which the threshold voltage is made lower than the threshold voltage of the diode $Z_n$-substrate. In this way, any injection of minority charge carriers into the substrate (in the described case electrons are concerned) is avoided, because the electrons created by thermal excitation and collected by the various $n^{115}$ zones of the illustrated assembly and by those forming part of the integrated circuit whose substrate is to be biased are ultimately transferred by the transistor $T_{n+1}$ to the zone $Z_o$ and from there to the $p^{115}$ zone, through the contact $e$.

The technique described above is of very particular importance within the scope of the biasing of the substrate of integrated circuits comprising insulated gate field effect transistors because it makes it possible to effect a perfect monitoring of the threshold voltage of such transistors.

It is known that, in a transistor of this kind, this threshold voltage depends essentially upon the doping of the substrate (which is a silicon monocrystal in most cases), upon the dielectric constant of the substrate and of the insulating layer separating the gate and the substrate, upon the thickness of the insulating layer, upon the difference of the work function of the substrate and of the gate, and upon the concentration of the surface states of the substrate. It is the mastering of this concentration which constitutes the major problem in the manufacture of this kind of transistor.

For a highly developed technology, such as, for example, that in which a Si monocrystal is employed as substrate, $SiO_2$ is employed as insulator and an aluminum layer is employed as the gate, the concentration of the surface states can be reduced to such a value that its influence on the threshold voltage is at most of the order of a tenth of a volt. Let us now consider in somewhat greater detail the characteristics of this type of transistor, assuming that the oxide layer has the thickness usual in production, that is to say, a thickness of $0.1\mu$. If the transistor forms part of a high-frequency low-consumption circuit, it is important that the capacitance of the drain in relation to the substrate should be low. Thus, in this case, it is important that the transconductance/input capacitance ratio of the transistor should be high. It is therefore advantageous to choose a N-type transistor, that is to say, a transistor in which the zones which represent the source and the drain are of $n$-type incorporated in a $p$-type crystal. It is well known that, by reason of the fact that electrons have a higher mobility than holes, with a given geometry of the transistor, the transconductance of the N-type transistor is about three times as high as that of the P-type transistor. In order to obtain a low capacitance of the drain in relation to the $p$-type crystal, it is necessary for the latter to be weakly doped. In this case, there is obtained a variation of the saturation current $i_s$ as a function of the gate voltage $V_G$ corresponding to that appearing on the characteristic curve I (FIG. 5). We here define the threshold voltage $V_T$ as being that obtained with $i_s = o$, by extrapolating it from the linear portion of this diagram, because in a wide range of values of the current $i_s$ the latter is proportional to $(V_G - V_T)^2$.

For very small values of the current $i_s$, the latter increases exponentially with the gate voltage. It may be roughly stated that in this very low current range the current increases by one order of magnitude when the gate voltage is increased by one-tenth of a volt. In accordance with the curve I, it is found that, with weak doping of the substrate, the threshold voltage is negative, which means that, with zero gate voltage, the transistor is already in a state of conduction. In the very great majority of logic circuit,s such transistors are undesirable. It may even be said that the very large majority of circuits are designed for transistors having a positive threshold voltage, that is to say, for transistors which allow substantially no current to pass with zero gate voltage.

It is well known that the curve I can be shifted in the direction of the arrow shown in FIG. 5 by increasing the doping of the substrate. The extent of the shift is not a linear function of the doping, but is rather substantially proportional to the square root of the latter. The capacitance of the drain also increases in like proportion, which is undesirable. It is known that it is possible to obviate this disadvantage by biasing the substrate, in our case the *p*-type crystal, negatively in relation to the source of the transistor, or more generally to the zone M which forms the "earth" of the integrated circuit to which there are connected all the sources of the circuit which are to be connected thereto (exceptions being, for example, transistors in "source follower" connection).

In this case, the shift of the curve I is quasi-proportional to the square root of the bias voltage. Such a bias also has the advantage that, in addition to the low capacitance of the drain due to the possible weak doping of the *p*-type crystal, the latter is further reduced almost in inverse proportion to the square root of the bias voltage.

Apart from the advantage just mentioned, the described bias circuit opens up new prospects for integrated circuits of the type known as "MOS capacitor pull-up-circuits" (see, for example, Robert H. Crawford and Bernard Bazin: "Theory and Design of MOS Capacitor Pull-up-Circuits;" IEEE Journal of Solid-State Circuits, Vol. SC 4 No. 3, June 1969).

As is known, this type of circuit contains only MOS transistors of a single type and MOS capacitors. Due to the simplicity of their structure, such circuits would also be very useful from the economic viewpoint. However, as is apparent from the article, the performance of such circuits is limited by bipolar effects, that is say, by effects which are due to minority charge carriers which are injected into the crystal from zones of opposite type. In the conclusion of the article, a number of proposals are made with view to reducing the harmful effect of these minority charges injected into the crystal. It is clear that, with the desired biasing apparatus, it is possible to bias the earth of this integrated circuit in relation to the crystal in such manner that no zone of opposite type can reach at any instant a potential such that an injection of minority charge carriers can occur.

Finally, it is to be noted that the integrated biasing assemblies illustrated in FIGS. 1 and 4 may also be used as voltage transformers (transformation of a low alternating voltage into a high unidirection voltage) for purposes very different from that described in the present application.

I claim:

1. In combination:

an integrated circuit having a substrate made of semiconductor material of one type of conductivity in which there are integrated *n* insulated gate field effect transistors each having a source region, a drain region, and a gate connected to the said drain region, the source regions of the said *n* field effect transistors being formed respectively by *n* zones of semiconductor material of opposite type of conductivity to the said substrate, the drain regions of the first to *n*-1th field effect transistors being formed by the second to *n*th zones respectively, and the drain region of the *n*th field effect transistor being formed by an *n*+1th zone of semiconductor material of the said opposite type of conductivity, the second to *n*+1th zones being capacitively coupled respectively with *n* electrodes; and signal-generation circuitry having *m* outputs and operative to provide at each output a periodic signal which is displaced in time with respect to the periodic signals provided at the other outputs;

each of the said *n* electrodes being connected to one of the said *m* outputs of the signal-generation circuitry, the said *m* outputs being connected to respective electrodes in each group of *m* consecutive electrodes formed from the *n* electrodes.

2. A combination according to claim 1, comprising an $n + 1$th insulated gate field effect transistor integrated in the substrate and having a source region, a drain region, and a gate, one of the said regions being formed by the $n + 1$th zone of semiconductor material and the other region being formed by an $n + 2$th zone of the semiconductor material of the said opposite type of conductivity, and the said substrate also having integrated therein a highly doped zone of the said one type of conductivity, the gate of the $n + 1$th field effect transistor being galvanically connected to the said $n + 2$th zone and to the said highly doped zone.

* * * * *